United States Patent
Danielson

(10) Patent No.: US 6,552,607 B1
(45) Date of Patent: Apr. 22, 2003

(54) TIME DIVISION MULTIPLEXED PWM AMPLIFIER

(75) Inventor: Michael Stephen Danielson, Wrentham, MA (US)

(73) Assignee: Apogee Technology Inc., Norwood, MA (US)

( * ) Notice: Subject to any disclaimer, the term of this patent is extended or adjusted under 35 U.S.C. 154(b) by 0 days.

(21) Appl. No.: 10/054,144

(22) Filed: Nov. 12, 2001

(51) Int. Cl.[7] ................................................ H03F 3/38
(52) U.S. Cl. ...................... 330/10; 330/146; 330/207 A
(58) Field of Search ....................... 330/10, 146, 207 A, 330/251, 124 R, 295

(56) References Cited

U.S. PATENT DOCUMENTS 5,382,915 A * 1/1995 Muri et al. .................. 330/10
6,294,957 B1 * 9/2001 Luu ........................... 330/251
6,313,697 B1 * 11/2001 Neuteboom et al. .......... 330/10

* cited by examiner

*Primary Examiner*—Henry Choe
(74) *Attorney, Agent, or Firm*—Brian L. Michaelis; Joseph P. Quinn; Brown Rudnick Berlack Israels LLP

(57) ABSTRACT

A bridged amplifier output stage capable of sharing a common conductor between independent loads. Multi-Channel pulse width modulated output signals are time division multiplexed to reduce the number of required conductors. The output stages are driven such that the non-common conductor time multiplexed off-channel(s) receives a copy of the shared common signal. The differential signal on the off-channel(s) is thereby cancelled even though the common conductor is carrying a signal for use by the on-channel.

9 Claims, 7 Drawing Sheets

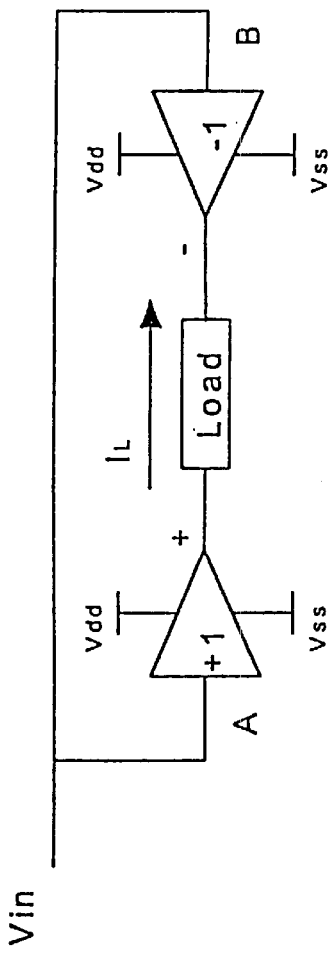
FIG. 1
(Prior Art)
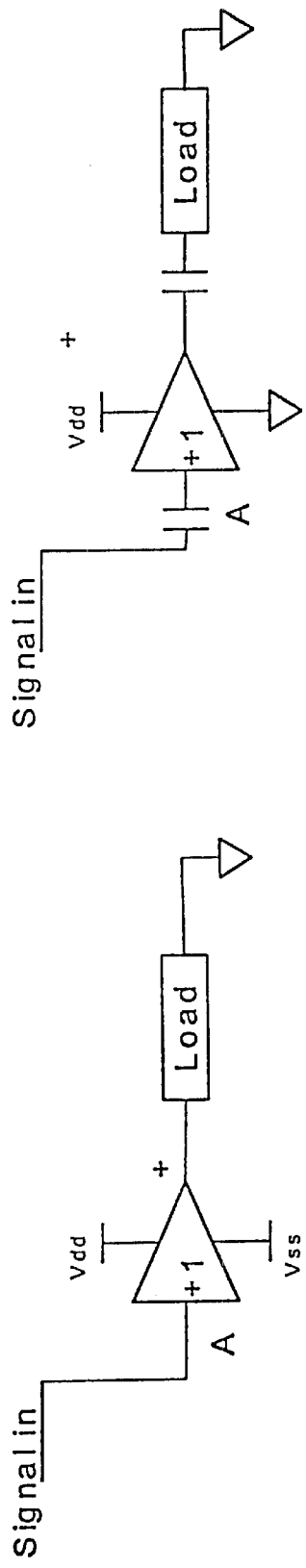
FIG. 3
(Prior Art)
FIG. 2
(Prior Art)

TIME DIVISION MULTIPLEXED PWM AMPLIFIER

FIELD OF THE INVENTION

The present invention relates generally to bridge circuits, and more particularly to bridged output drive circuitry for amplifiers.

BACKGROUND OF THE INVENTION

It is helpful to consider the features of certain analog amplifiers and certain digital amplifiers known in the art in order to understand the advantages of the present invention.

The disadvantages of analog amplifiers are well known and numerous mechanisms have been implemented in the art to overcome their deficiencies. Efforts to overcome the poor efficiency of analog amplifiers, among other things, gave rise to the development of relatively higher efficiency switching amplifiers. However, switching amplifiers have their own deficiencies, including difficulties in processing small signals without undesirable distortion. Binary switching amplifiers, in particular, are known to produce ripple in small output signals when a modulation carrier frequency is removed from the amplified signal.

Mechanisms to improve the performance of binary switching amplifiers have involved implementing more output switching states. The conventional two output states of binary switching amplifiers have been supplemented, and performance has been improved by known switching amplifiers implementing third ("ternary") and fourth ("quaternary") output switching states. For instance, U.S. Pat. No. 5,077,539 ("the '539 patent") issued Dec. 31, 1991, owned by the present assignee and incorporated herein by reference, describes ternary and quaternary modes of switching operation implemented in an amplifier design to overcome distortion affecting small signal inputs to the switching amplifier.

Ternary or tri-state mode waveforms represent input signal amplitude information as the timed width and polarity pulses, comprising discrete amplitudes of zero, positive or negative polarity. With ternary techniques, signal information is directly converted to appropriately wide pulses of positive or negative polarity.

The ternary implementation as disclosed in the referenced patent, however, contains an error source which limits its use in audio or servo motor amplifier applications. This error source produces output signal distortion because of non-linearity in the output transfer function for small input signals, specifically as the input signal transitions through zero. For small input signals, performance degradation results because of the finite rise and fall times of the output signals produced by the power switching circuit. These switch times represent a fixed magnitude error, subtracted from a diminishing magnitude signal, which produces a non-linear gain characteristic and signal distortion.

In order to overcome the non-linear behavior of the tri-state embodiment, it is known in the prior art to introduce a fourth state, specifically to linearize the output transition through zero. For small input signals, the four-state or quaternary embodiment, which is described in detail in the referenced patent, employs an analog amplifier to affect a linear transition through zero. This fourth output state employs a linear analog amplifier in conjunction with ternary switching to linearize small signal performance. Below a predetermined signal magnitude, the load is switched to the linear analog amplifier and the ternary power switch is disabled. Above the magnitude threshold, the power switch is enabled and the load is disconnected from the linear amplifier. This compromise solution offers certain advantages, however, like the binary and ternary implementations, it suffers particular disadvantages.

The ternary and quaternary techniques known in the prior art accept an analog input signal, which in those analog implementations require no signal conversion means to interface to a linear analog amplifier. In those implementations, all signal processing uses analog means, i.e. analog circuitry is used to implement signal conversion, pulse width modulation control, and output linearization for small signals. However, these analog implementations are not cost effective because, for example, very large scale integrated circuitry can not be economically used to implement the analog designs. The alternative non-integrated configuration occupies excessive space.

Furthermore, for amplifier input signals that are inherently digital, as from the output of digital audio media, CD-ROM, digital control systems, or the like, the analog prior art requires signal conversion circuitry to interface with the analog switching amplifier implementations(s). Interface circuitry at the front end of the amplifier can degrade performance and further burden system cost.

An all digital switching amplifier that can be implemented on low cost application specific integrated circuits is disclosed in U.S. Pat. No. 5,617,058 to Adrian et al. ("the '058 patent") also owned by the present assignee and incorporated herein by reference. The all digital switching amplifier of the '058 patent provides linearization of the power switch solely by using three states.

According to the '058 patent, in an all digital implementation, a small fixed width, bi-state compensating pulse wave-form is added to the leading or trailing edges of an oversampled main input pulse producing a compensated waveform. This compensating pulse linearizes output from a power switch by effecting common mode cancellation of switch time errors.

A correction mechanism is implemented to correct for harmonic distortion resulting from the compensation pulse, also referred to as the pulse carrier or carrier, which is dependent on the modulation level or index. Harmonic distortion is corrected by the correction mechanism applying the inverse of the modulation induced distortion to the pre-processing of the input signal amplitude information so as to null distortion products resulting from the modulation scheme used to apply the small carrier to linearize the performance of the tri-state power switch.

The correction mechanism is implemented using digital signal processing (DSP) that facilitates application of the inverse of the modulation induced distortion to the oversampled input signal. Coefficients required by the correction mechanism to compute the induced distortion correction are derived from a look-up table referenced by the estimated amplitude of the input signal.

In further accord with the '058 patent, digital timing control of the power switch's deadband is effected. Digital deadband control ensures accuracy of the timing and sequence in which individual switches within a power switch H-bridge are turned off and turned on, so as to preclude a situation where both upper and lower switches on one side of the bridge are both turned on at the same time. Accurate digital timing appropriately sequences the break-before-make timing to avoid a short circuit across the power supply. In the all digital design according to the '058 patent, a high speed clock used to generate the pulse width modulated waveforms to linearize the output from the power switch by common mode cancellation of switch time errors, can also be used to provide a timing reference to generate the necessary deadband timing delays required for the power switches, producing a much more stable switching situation.

Additionally, in an all digital audio amplifier embodiment according to the '058 patent, each individual switch's timing can be adjusted appropriately to accomplish a zero-voltage switch transition between the main pulse and the compensating pulse by providing a short period in which non-e of the switches are turned on. A conventional bridge is implemented using enhancement mode MOSFETs so that current will continue to flow through the body source-drain diodes of the alternate two switches to be turned on causing the diodes to become forward biased. When the diodes are forward biased, the voltage across the off switches is substantially zero, permitting a cleaner turn-on. Use of enhancement mode MOSFETs in an H-Bridge switch configuration provides higher efficiency, faster switching speeds, and cleaner outputs with reduced Electromagnetic Interference (EMI), in the context of an all digital amplifier embodiment.

Bridged power output drives for amplifier circuits are well known. In general, all methods of using such bridged power outputs to drive an electrical load require the load to be connected between two output stages and that the two output stages are opposite in gain polarity. Such output configuration is used regardless of type of output stage. For example, any type of continuous analog or pulse width modulated output stages having bridged output drives are configured with antiphase gain amplifiers across a load.

A typical bridged output drive is illustrated in FIG. 1. When an applied signal at Vin has positive polarity, drive current flows from Vdd(A) through the load to Vss(B). When an applied signal at Vin has negative polarity, drive current flows from Vdd(B) through the load to Vss(A). The power supplies for the output stages may be unipolar, i.e. Vss=ground or bipolar, i.e. Vss=−Vdd.

Bridged output configurations advantageously provide twice the voltage across a load (2 (Vdd−Vss) peak to peak), compared to a load that is driven by a single output stage having the same power supply voltage. FIG. 2 illustrates such a single ended output drive circuit wherein the maximum peak to peak voltage across the load is Vdd−Vss. FIG. 3 illustrates a single ended output drive circuit wherein the maximum peak to peak voltage across the load is Vdd. The configuration according to FIG. 3 is required for single ended output stages driving a grounded load with a single supply voltage, i.e., Vss=ground.

AC applications of single ended output configurations having a grounded load as illustrated in FIG. 3 disadvantageously require an output coupling capacitor to block common mode DC components and thereby prevent continuous current from flowing through the load. Proper operation in AC applications driving a grounded load requires the input signal to cause the output signal to swing symmetrically about Vdd/2. The maximum peak to peak voltage available across the load is then Vdd. In comparison, the bridged configuration as illustrated in FIG. 1 provides maximum peak to peak voltage of 2 Vdd at the load for Vss=ground. Consequently, the bridged configuration provides four times the power of the single ended output configuration.

Known bridge configurations disadvantageously require independent "common" connectors. Multiple bridged output circuits require at a minimum four wire connections to their respective loads because both sides of each load are connected to active output stage components. This is particularly disadvantageous in certain low cost audio systems wherein it is desirable to minimize the number of conductors to drive two loads, for example in audio speakers or headphones wherein substantiated cost savings can be achieved by parts reduction and/or space savings.

U.S. Pat. No. 6,097,249 to Strickland, et al. entitled "Method and Device for Improved Class BD Amplification Having Single-Terminal Alternating-Rail Dual-Sampling Topology" (hereinafter referred to as "the Strickland patent") teaches a method of ground referencing a Class BD, (ternary), amplifier. The invention disclosed in the Strickland patent avoids using a bridged output stage by effectively placing a Class AD, (binary) output amplifier as a load element between two additional Class AD power supply amplifiers. The AD amplifiers are composed of half bridges: one operating between Vdd and ground and the other operating between ground and Vss. This configuration allows the output amplifier to provide a three state output to a load that is ground referenced wherein the three states are: positive voltage, Vdd; zero voltage, ground; and negative voltage, Vss. A Class BD, (ternary) output is thereby generated without a bridged output stage.

While the method taught by the Strickland patent could be used to allow sharing of a common conductor between two loads, it is too complex for applications requiring low cost or integrated circuit solutions. For example, in one embodiment the Strickland invention requires at least two power rails, Vdd and Vss, and a means of switching the output amplifier power rails to operate either between Vdd and Ground or Vss and Ground. For a single channel this requires a minimum of six switches to perform the function of four in a traditional H-bridge configuration. The large number of switches required makes such embodiments impractical for many applications. These embodiments also suffer the additional complexity of controlling the additional switches, i.e. the dual sampling.

In an alternate embodiment of the Strickland invention, a floating power supply system is described which eliminates one pole in the rail-alternation switch, that is, two of the six switches are eliminated. However, as the Strickland patent states, this embodiment suffers from a serious disadvantage in that it produces significant electromagnetic emissions that are difficult to suppress.

In either embodiment, the method and apparatus disclosed in the Strickland patent does not provide a solution for applications requiring any combination of low cost, low power or inclusion in integrated circ.

SUMMARY OF THE INVENTION

The present invention provides a (direct digital) PWM bridged output drive capable of providing two independent channels of pulse width modulated variable power output into two loads, (such as stereo loudspeakers or headphones), using only three conductors instead of the four normally required for two channels of a bridged amplifier output configuration.

According to the invention, implementation of two channels over only three conductors is accomplished by time division multiplexed use of a common lead between the two loads. Signals on the common conductor are time division multiplexed by offsetting the output channels by a half frame.

In an illustrative embodiment of the invention, four output conductors from an H-Bridge driver driving two channels are connected to the illustrative output stage. The four conductors are applied to the inputs of a set of three appropriately connected OR-gates. The OR-gates provide a set of three signals which when combined provide a pair of non-interfering time division multiplexed signals sharing a single common conductor. The set of OR-gates are configured to facilitate tracking of the common conductor by the non-common conductor on the off channel. Such tracking ensures that the differential signal on the off-channel is null.

The loads can be referenced to a common conductor similarly to the way ground is used as a common conductor when using a single supply configuration according to the present invention without requiring AC coupling capacitors as do single supply amplifiers of the prior art (e.g., as in FIG. 3), driving loads that are referenced to ground. Power delivered to such a load by a single power supply voltage according to the present invention is the same as the power delivered by the prior art amplifier stage even though it is only operating a maximum of half of the time resulting in a substantial increase in efficiency.

Features of the invention include provision of an amplifier that operates in a classical bridged configuration from a single power supply voltage while driving a load that shares a common conductor with another load. It does not require AC coupling (DC blocking) capacitors that limit low frequency response as do other single supply amplifier applications that reference the load to ground (e.g., as in FIG. 3).

The invention overcomes several limitations of the prior art and features a method and apparatus for multiplexing bridged output circuits to reduce the number of required output stage conductors driving multiple loads while maintaining the advantages of bridged output configurations. The invention also features a method and apparatus for multiplexing bridged outputs for AC applications using a reduced number of conductors and a reduced number of output stages and which does not require AC coupling capacitors. The invention further retains all of the benefits of the linearized tri-state power switch bridged drive configuration described in the '058 patent. Because the bridged architecture produces the same power as the AC coupled amplifier of FIG. 3 while operating a maximum of half of the time, it provides at a minimum double the efficiency the prior art architectures.

BRIEF DESCRIPTION OF THE DRAWINGS

These and other features of the present invention will be better understood when reading the following detailed description taken together with the accompanying drawing wherein:

FIG. 1 illustrates an output bridge configuration having two output stages driving a load according to the prior art;

FIG. 2 illustrates a single ended output stage driving a load according to the prior art;

FIG. 3 illustrates a single ended output stage driving a grounded load and including AC coupling capacitors according to the prior art;

FIGS. 8 and 9 show representative data for an 8 ohm loads being driven by the DDX2060 operating at 8V wherein FIG. 8 is an illustration of THD+N (total harmonic distortion+ noise) vs. frequency with a single channel driven and FIG. 9. is an illustration of THD+N vs. Amplitude with a single channel driven.

DETAILED DESCRIPTION OF THE INVENTION

Figure 4:
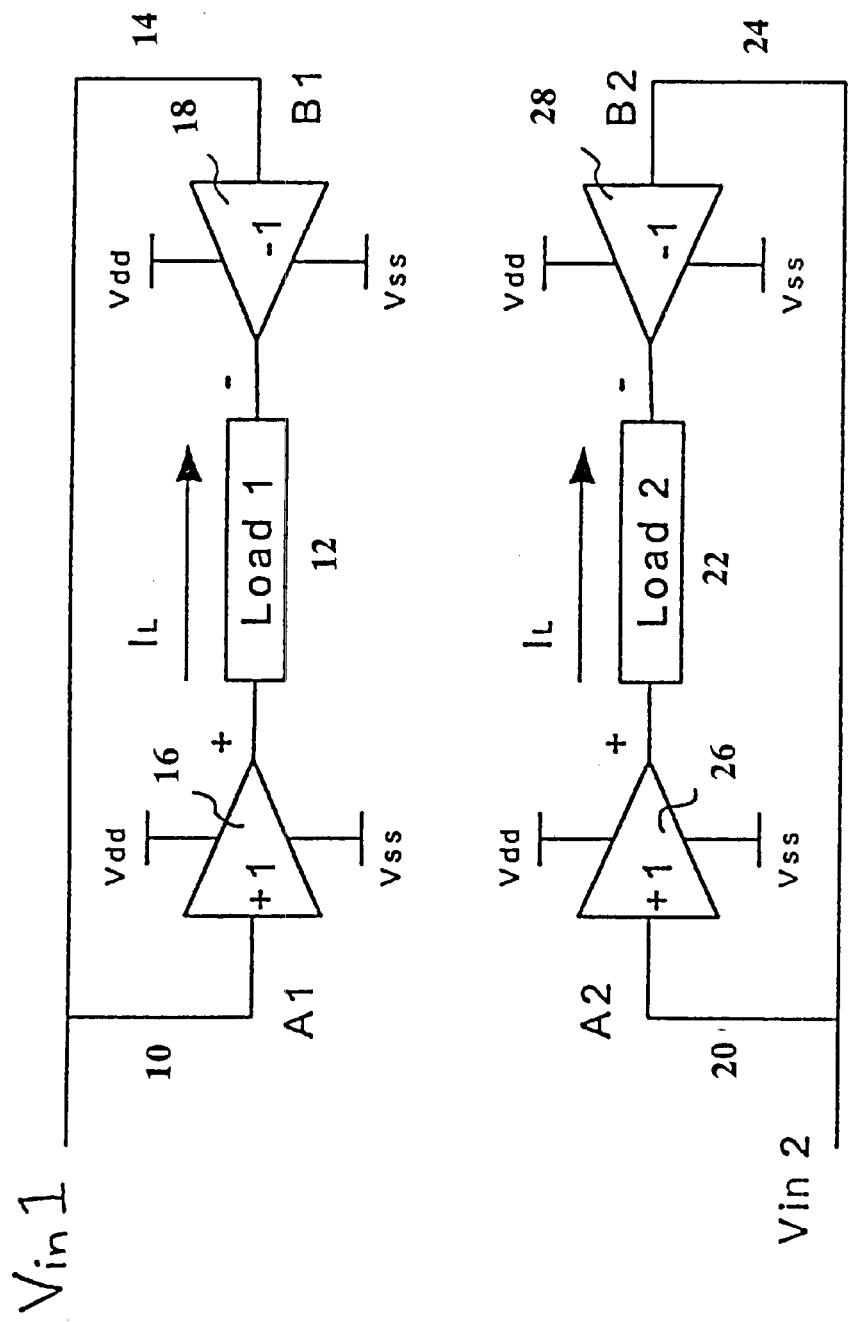
FIG. 4 illustrates a pair of bridged output states driving a pair of loads with four conductors according to the prior art.

The invention can be understood with reference to FIG. 4 which illustrates a bridged output amplifier configuration driving two loads with four output stages according to the prior art. The positive part 10 of signals to a first load 12 are amplified by first output stage 16 which has a positive gain; the negative part 14 of signals to the first load 12 are amplified by second output stage 18 which has a negative gain. A power supply (not shown) provides power at Vdd–Vss volts to each amplifier stage. The simultaneous push and pull of the first output stage 16 and second output stage 18 provides maximum amplification of the input signal to twice the power supply voltage (2*(Vdd–Vss)).

Similarly with respect to a second load 22, the positive part 20 of signal to the second load 22 are amplified by first output stage 26 which has a positive gain; the negative part 24 of signals to the second load 22 are amplified by second output stage 28 which has a negative gain. The signal to the second load 22 therefore also has a maximum gain of twice the power supply voltage (2*(Vdd–Vss)).

The bridged output amplifier configuration of FIG. 4 requires a pair of conductors to each load: one conductor from each amplifier stage. In many applications it is desirable to minimize the number of conductors and amplifier stages used to drive a set of loads while retaining the advantages of a bridged configuration. For example, reducing the number of conductors from four to three in low cost audio speaker systems and audio headphones provides a significant cost reduction.

Figure 5:
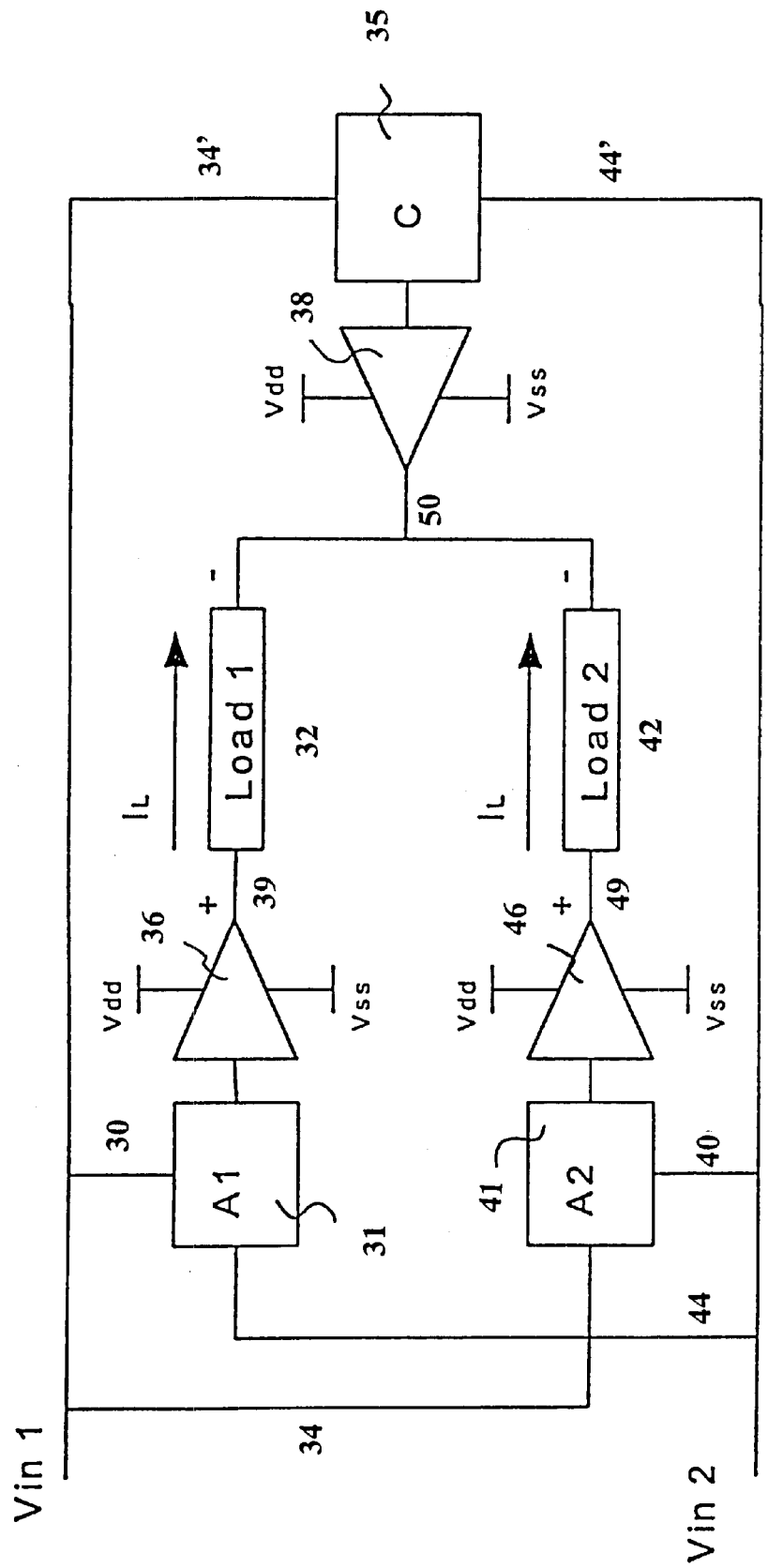
FIG. 5 illustrates a pair of bridged output stages driving a pair of loads using three conductors according to at least one embodiment of the present invention.

A bridged output amplifier according to at least one embodiment of the present invention is illustrated in FIG. 5. A first side of each load 32, 42 is connected to a common amplifier stage 38. A second amplifier stage 36 is connected to the second side of first load 32. A third amplifier stage 46 is connected to the second side of second load 42. All three amplifier stages have positive gain. The non-common part 30 of signals to the first load 32 are provided through a first circuit component 31 and the second amplifier stage 36. The common part 34' of signals to the first load 32 are provided to the first side of the first load 32 through common circuitry 35 and the first amplifier stage 38. The non-common part 34 of signals to the first load 32 is also provided to the second side of second load 42 through a second circuit component 41 and the third amplifier stage 46. Similarly, the non-common part 40 of signals to the second load 42 is provided through the second circuit component 41 and the third amplifier stage 46. The common part 44' of signals to the second load 42 are provided to the first side of the second load 42 through common circuitry 35 and the first amplifier stage 38. The common part 44 of signals to the second load 42 is also provided to the second side of the first load 32 through the first circuit component 31 and the second amplifier stage 36.

Figure 6:
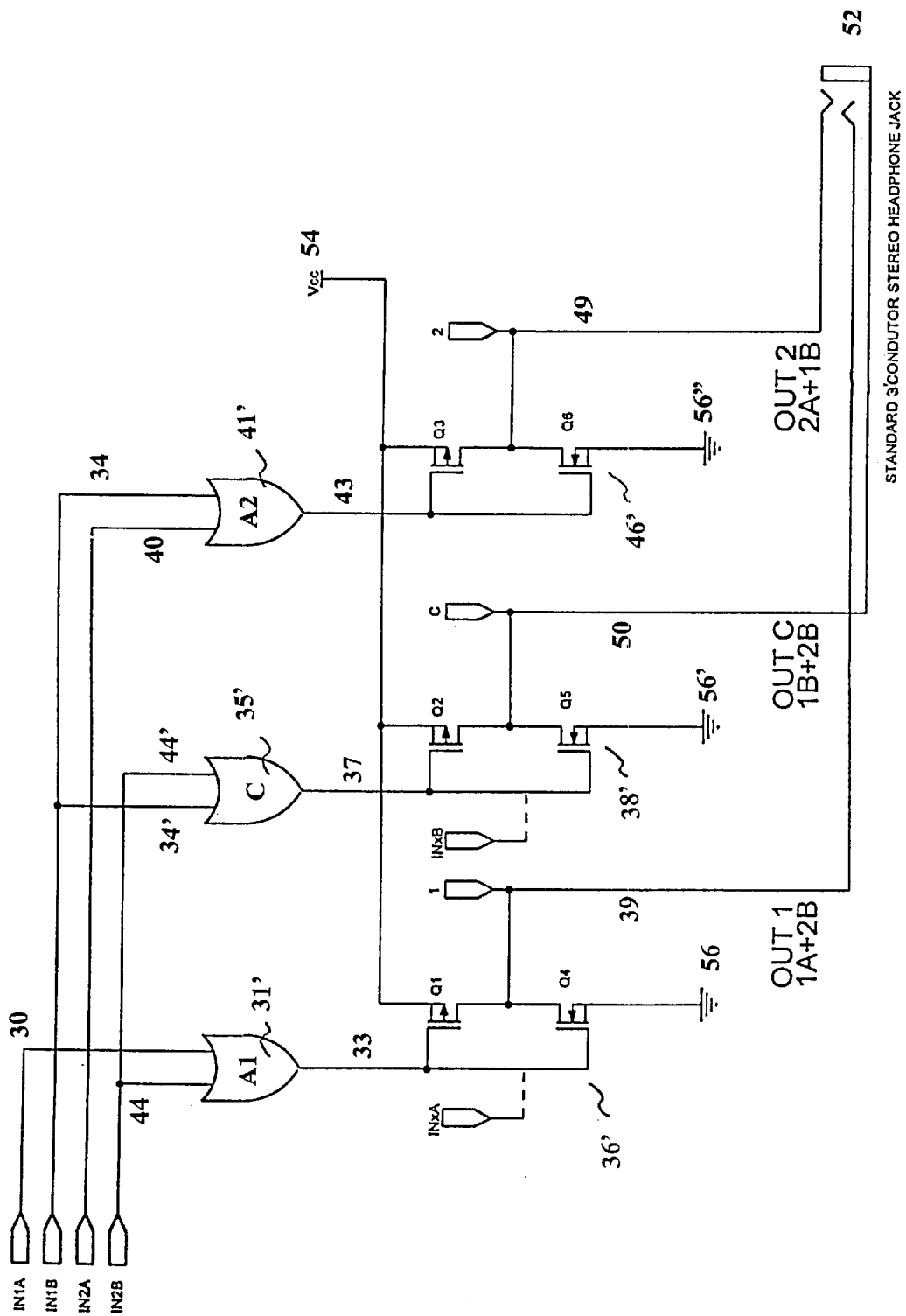
FIG. 6 is a schematic illustration of logic circuitry implementing an embodiment of the present invention with three conductors driving two loads.

An output configuration according to at least one embodiment the present invention is shown schematically in FIG. 6. FIG. 6 can be understood along with FIG. 5 whereby: signal IN1A corresponds to the positive part 30 of the signal to the first load 32; signal IN1B corresponds to the negative part 34,34' of the signal to the first load 32; signal IN2A corresponds to the positive part 40 of the signal to the second load 42; and signal IN2B corresponds to the negative part of the signal to the second load 44, 44'.

Referring now to FIG. 13A of the '058 patent which illustrates a two channel compensated pulse width modulated audio amplifier configuration with four signals driving each H Bridge. FIG. 12 of the '058 patent show these four signals in detail as AHO, ALO, BHO and BLO. These signals are intended to control upper and lower MOSFETs in two half bridges where: xHO controls the upper MOSFET; xLO controls the lower MOSFET; and A and B represent the two independent half bridges that form the full H bridge.

It should be apparent to persons skilled in the art that a half bridge composed of complementary pairs, i.e., Pch and Nch MOSFETs as shown in FIG. 6, can be controlled by a single signal, INxx, as described herein to perform the same function of xHO and xLO. It should also be apparent to persons skilled in the art that any required deadband delay may be provided in an integrated circuit, or otherwise, as necessary to prevent cross conduction by decomposing INxx back into xHO and xLO.

Three OR gates 31' 35' and 41' correspond to the first circuit component 31, the common circuitry 35 and the second circuit component 41. Signals IN1A 30 and IN2B 44 are input to a first OR gate 31'. Signals IN1B 34' and IN2B 44' are input to a second OR gate 35'. Signals IN2A 40 and IN1B 34 are input to a third OR gate 41'. Output from the first OR gate 31 ' is provided to a first half bridge 36' including Q1 and Q4. Output from the second OR gate 35' is provided to a second half bridge 38' including Q2 and Q5. Output from the third OR gate 41' is provided to a third half bridge 46' including Q3 and Q6.

The first half bridge 36' provides amplified output 39 to the first load. The third half bridge 46' provides amplified output 49 to the second load. The second half bridge 38' provides common amplified output 50 to the first and second loads. Power is provided to the amplifier stages 36' 38' and 46' by their connection between a power supply at Vcc 54 and ground 56, 56', 56". In a headphone application, output to headphone speakers is provided along three conductors through a headphone jack 52.

The configuration according to FIG. 6 allows a common amplifier stage and a common output conductor to be shared by a pair of loads without allowing the signals of each load to interfere with each other. Operation of the illustrated embodiment of the invention can be understood with reference to FIGS. 5 and 6 along with the illustration of signal timing in FIG. 7.

One end if each load is tied in common to an output stage. If each channel is considered individually, the normal bridge configuration according to the prior art (ref. FIG. 4) is preserved, i.e. input to the first circuit component=Vin1 and input to the common circuitry =–Vin1, etc. However the common connection between loads can not simultaneously be –Vin1 and –Vin2. The first and second circuit components and the common circuitry function to select which signal is applied to the loads so that only one load is on at any instant in time. Starting with the first load, the proper signal is applied when input to the first circuit component= Vin1, input to the common circuitry=–Vin1 and input to the second circuit component=–Vin1. This way, the second load sees –Vin1 at each end resulting in no net signal across the second load. Similarly for the second load, the proper signal is applied when input to the second circuit component=Vin2, input to the common circuitry=–Vin2 and input to the first circuit component=–Vin2, so signals to the first load are cancelled. Such signals may be provided using analog input signals if the first and second circuit components and the common circuitry and the output drivers have sufficient bandwidth to switch between Vin1 and Vin2 at a rate exceeding the input signal frequency by a sufficient margin to avoid diminishing output signal fidelity. Such high frequency switching is difficult to implement in practical amplifier circuits.

Time multiplexing of the common connection is possible using Class D amplifiers (power output stages). In general, Class D amplifiers operate by time modulating a switched waveform either to produce a pulse width proportional to the input signal or to provide a density of pulses per unit time proportional to the input signal. Class D amplifiers switch signals at high frequencies relative to the frequencies of the signals being reproduced. By their nature, Class D amplifiers deliver power in packets of time and so lend themselves to time division multiplexing, TDM, of signals. Signals that are pulse width modulated with a compensating carrier waveform according to the '058 patent are particularly suitable to drive an illustrative output stage because they are inherently time division multiplexed into positive and negative parts and can be offset by, and constrained to modulate over a half frame.

The function of at least one embodiment of the invention can be further understood with reference to FIG. 6. Input drive signals IN1A, IN1B, IN2A and IN2B are generated by digital signal processing means such as those taught by U.S. Pat. No. 5,617,058 to Adrian et al. (the Adrian '058 patent) which is incorporated herein by reference. Applying signal INxA to one half bridge (the Q1, Q4 combination) and applying INxB to another half bridge (the Q2, Q5 combination) and connecting a load between the two half bridges at points 1 and C will result in a linearized tri-state waveform as described in the Adrian '058 patent. The Q2, Q5 combination and the Q1, Q4 combinations are embodiments of the power output stages that are represented in FIGS. 1–5. In practice, a reconstruction filter is only required if radiated emissions exceed regulatory limits. Otherwise, signal filtering has been determined to be unnecessary for low power applications such as headphones and low power speakers.

Figure 7:
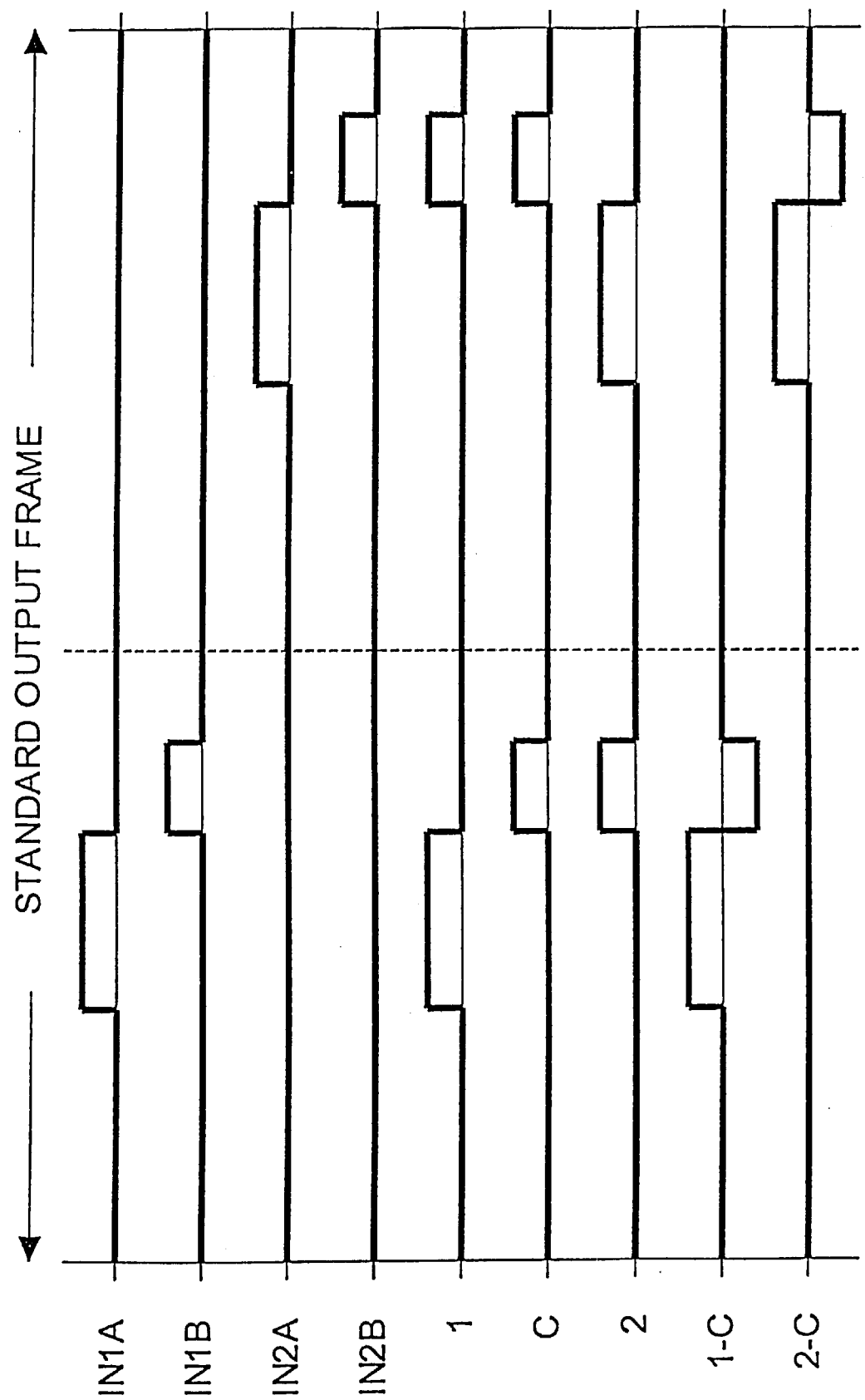
FIG. 7 represents a timing diagram of signals on four input signal wires relative to signals on three load conductors according to at least one embodiment of the present invention.

FIG. 7 shows the timing relationship of outputs 1, C and 2 to inputs IN1A, IN1B, IN2A and IN2B. Modulation can be operated over a half frame interval without interfering with the opposite channel's operation by offsetting the two output channels by a half frame and restricting the maximum modulation to a half frame interval. This allows the two channels to be time multiplexed within the time of a signal frame thus maintaining the same output switch rate. The non- operating channel is provided with the same signal as the common so that signal flow through the non- operating load is prevented. For example, when channel 1 is operating, channels 2 and C operate in phase to cancel each other . This results in the net output shown the difference 1–C as taught by the Adrian '058 patent.

An embodiment of the invention has been successfully demonstrated using the Apogee DDX2000/DDX2060 digital amplifier chip set combination with additional logic as diagrammed in FIG. 6. The DDX2060 power device is operated from a voltage of 8 V to avoid tripping an undervoltage cutoff in the device. The load impedance was 8 ohms. All of the illustrated data sets correspond to these conditions. This embodiment of the present invention serves the needs of low power amplifiers applications such as headphone applications. The results are extrapolated for typical representative applications with both 3.3 V and 5 V power supplies and for loads ranging form 8 ohms to 16 ohms to show that adequate power can be generated in this application. The total harmonic distortion plus noise (THD+N) was measured to be 0.2% which corresponds to a signal to noise ratio of 80 decibels full scale (dBFS). In summary, the following results were achieved with the embodiment operating at 8 V. The total harmonic distortion plus noise (THD+N) was measured to be ≦0.2% and the signal to noise ratio was measured to be ≧80 dB A-weighted relative to a full scale, ½ frame modulated signal.

Figure 8:
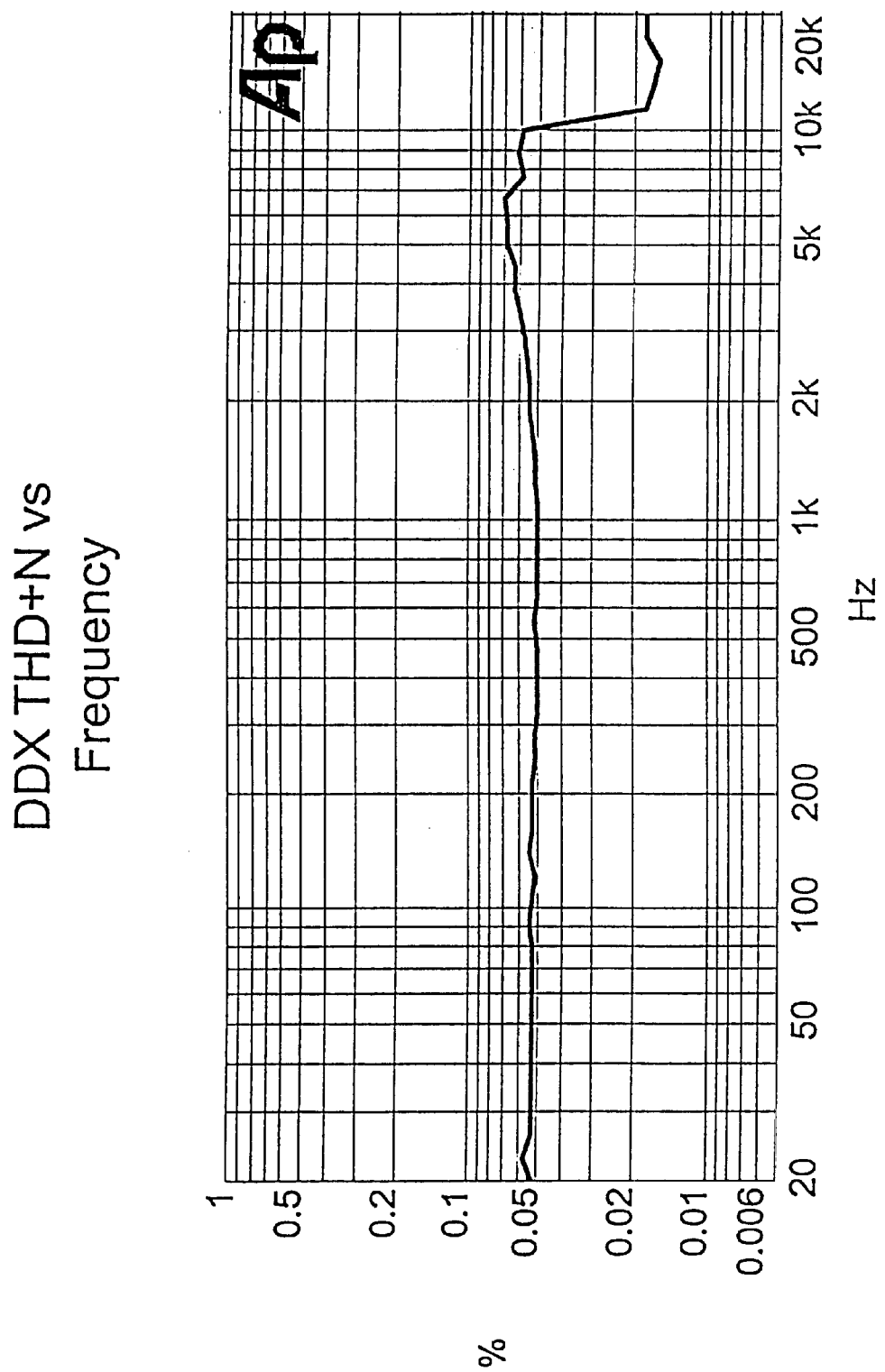
Figure 9:
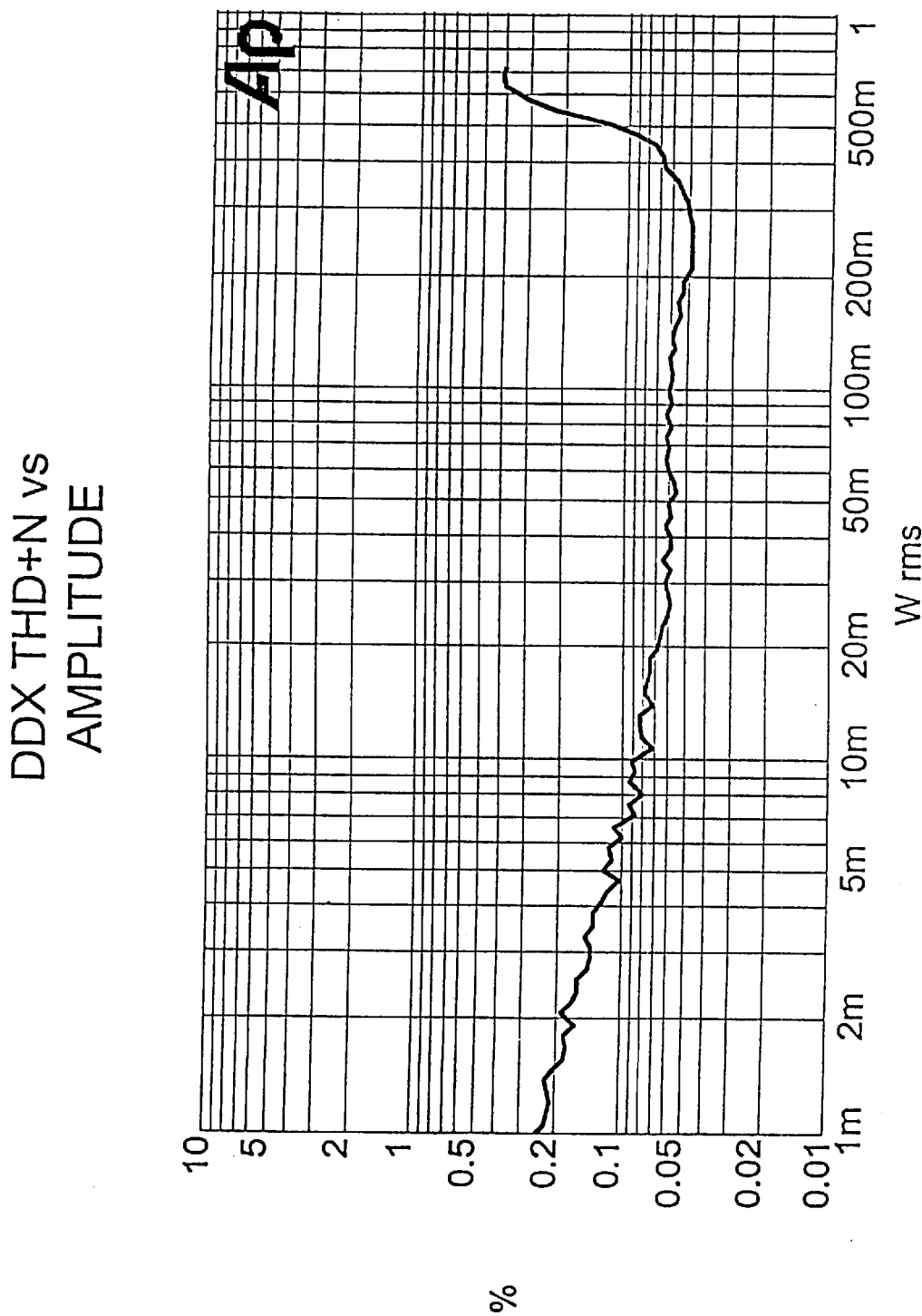

Representative data is shown in FIGS. 8–10 for 8 ohm loads being driven by the DDX2060 operating at 8 V. A second order low-pass filter as described in the DDX2060 datasheet was used in the prototype to take data. The second order filter was determined to be unnecessary in the application for any reason of audibility.

FIG. 8 is a graph of total harmonic distortion plus noise (THD+N) as a function of signal frequency in Hertz (Hz) for a single-channel output having equivalent power of 24 mW with a 16 ohm load or 48 mW with an 8 ohm load at a supply voltage of 3.3 V. The vertical axis of the graph in FIG. 8 indicates distortion in units of percent of total harmonic distortion plus noise relative to an ideal signal. The horizontal axis indicates the signal frequency in Hz.

FIG. 9 is a graph of total harmonic distortion plus noise (THD+N) at 1 kHz as a function of signal power in Watts (root mean square) (W rms) for a single-channel driven to full half frame modulation delivers up to 700 milliwats (mW) into an 8 ohm load. Equivalent power into a 16 ohm load would be 60 mW from a 3.3 V supply or 137 mW from a 5 V supply. Power output using a 3.3 V supply into an 8 ohm load would be 119 mW.

Although the circuit components and common circuitry described herein according to the invention are implemented illustratively in the form of OR gates, it should be appreciated that these aspects of the invention can be implemented by various circuit configurations and/or combinational logic elements.

While the illustrative implementation of the invention is described in terms of a pulse width modulated signal, it should be appreciated that the invention can be implemented by operating on various types of signals such as pulse density modulation, pulse amplitude modulation and any other modulation technique that lends itself to time division multiplexing. It should also be obvious to those skilled in the art that the method according to the present invention is extensible to an arbitrary number or channels, N, sharing a common conductor by dividing a frame into 1/N segments and arranging the necessary drive logic to cause all but the active channel to track the modulation of the common conductor.

Although the invention is described herein with respect to illustrative embodiments thereof, it should be appreciated that the foregoing and various other changes, omissions or additions in the form and detail thereof may be made without departing from the spirit and scope of the invention.

What is claimed is:

1. A bridged output amplifier comprising:
   a first channel including a first channel first conductor and a first channel second conductor;
   a second channel including a second channel first conductor and a second channel second conductor;
   a first OR-gate having as input said first channel first conductor and said second channel second conductor, said first OR-gate having an output connected to a first amplifier stage;
   a second OR-gate having as input said first channel second conductor and said second channel second conductor, said second OR-gate having an output connected to a second amplifier stage;
   a third OR-gate having as input said first channel second conductor and said second channel first conductor, said third OR-gate having an output connected to a third amplifier stage;
   wherein said first amplifier stage provides an output to a first side of a first load;
   wherein said third amplifier stage provides an output to a first side of a second load; and
   wherein said second amplifier stage provides an output to a second side of said first load and a second side of said second load.

2. The bridged output amplifier according to claim 1 wherein said first load and said second load are audio speakers.

3. The bridged output amplifier according to claim 1 wherein said first channel and said second channel provide pulse width modulated signals to said amplifier stages.

4. The bridged output amplifier according to claim 3 wherein said pulse width modulated signals on said first channel are offset by half frame relative to said pulse width modulated signals on said second channel.

5. A method of providing two independent channels of electrical power into separate electrical loads using three power conductors comprising:
   providing pulse width modulated signals to a first channel, said first channel comprising a first channel first conductor and a first channel second conductor;
   providing a pulse width modulated signal to a second channel, said second channel comprising a second channel first conductor and a second channel second conductor, wherein said pulse width modulated signal to said second channel is offset by ½ frame relative to said pulse width modulated signal to said first channel;
   applying signals on said first channel first conductor and said second channel second conductor to a first OR-Gate;
   applying signals on said first channel second conductor and said second channel second conductor to a second OR-Gate;
   applying signals on said first channel second conductor and second channel first conductor to a third OR-Gate;
   applying output from said first OR-Gate to a first amplifier stage;
   applying output from said second OR-Gate to a second amplifier stage;
   applying output from said third OR-Gate to a third amplifier stage;
   applying output from said third OR-Gate to a third amplifier stage;
   applying output from said first amplifier stage to a first side of a first load;
   applying output from said third amplifier stage to a first side of a second load; and
   applying output from said second amplifier stage to a second side of said first load and a second side of said second load.

6. A bridged output amplifier comprising:
   a first channel including a first channel first conductor and a first channel second conductor;
   a second channel including a second channel- first conductor and a second channel second conductor;

a first means having as input said first channel first conductor and said second channel second conductor, said first means having an output connected to a first amplifier stage;

a second means having as input said first channel second conductor and said second channel second conductor, said second means having an output connected to a second amplifier stage;

a third means having as input said first channel second conductor and said second channel first conductor, said third means having an output connected to a third amplifier stage;

wherein said first amplifier stage, provides an output to a first side of a first load;

wherein said third amplifier stage provides an output to a first side of a second load; and wherein said second amplifier stage provides an output to a second side of said first load and a second side of said second load.

7. The bridged output amplifier according to claim 6 wherein said first load and said second load are audio speakers.

8. The bridged output amplifier according to claim 6 wherein said first channel and said second channel provide pulse width modulated signals to said amplifier stages.

9. The bridged output amplifier according to claim 8 wherein said pulse width modulated signals on said first channel are offset by a half frame relative to said pulse width modulated signals on said second channel.

* * * * *